(12) United States Patent
Sahm et al.

(10) Patent No.: US 7,586,427 B1
(45) Date of Patent: Sep. 8, 2009

(54) SEQUENTIAL TRIGGERING OF SERIES-CONNECTED RESONANT TUNNELING DIODES

(75) Inventors: Peter Henrick Sahm, Spring Grove, IL (US); Erik Michael Zeliasz, Cary, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 12/109,032

(22) Filed: Apr. 24, 2008

(51) Int. Cl.
*H03M 1/00* (2006.01)
(52) U.S. Cl. .......................... 341/133; 257/25
(58) Field of Classification Search ................ 341/133, 341/144, 155, 141; 257/25
See application file for complete search history.

(56) References Cited

U.S. PATENT DOCUMENTS

| | | | |
|---|---|---|---|
| 3,184,614 A | 5/1965 | Harrison | |
| 3,209,158 A | 9/1965 | Neff et al. | |
| 3,219,997 A | 11/1965 | Lewyn | |
| 3,329,832 A | 7/1967 | Ulrich | |
| 3,334,306 A | 8/1967 | Jensen | |
| 3,487,235 A | 12/1969 | Karner | |
| 5,444,751 A | 8/1995 | Sage | |
| 5,554,860 A * | 9/1996 | Seabaugh | 257/25 |
| 5,945,934 A * | 8/1999 | De Los Santos | 341/139 |
| 6,323,696 B1 * | 11/2001 | Hickling et al. | 327/92 |
| 6,323,709 B1 | 11/2001 | Kulkarni et al. | |
| 7,403,032 B2 * | 7/2008 | Yang et al. | 326/6 |

OTHER PUBLICATIONS

Mazumder, et al.: "*Digital Circuit Applications of Resonant Tunneling Devices*"; Proceedings of the IEEE, vol. 86, No. 4, Apr. 1998, pp. 604-686.
Wei, et al.: "*High Speed A/D Converter Using Resonant Tunneling Diodes*"; 0-7803-053-0/92 IEEE 1992, pp. 577-580.
Waho, et al.: "*Ultrafast Analog-to-Digital Converter Using Resonant-Tunneling Ternary Quantizers*"; 0-7803-4471-5/98 IEEE 1998 MTT-S Digest, pp. 197-200.

* cited by examiner

*Primary Examiner*—Peguy JeanPierre
(74) *Attorney, Agent, or Firm*—Tarolli, Sundheim, Covell & Tummino LLP (57) ABSTRACT

One embodiment of the invention includes a quantization circuit. The circuit comprises a sense resistor configured to provide a voltage that is indicative of a digital quantization of an input voltage. The circuit also comprises a plurality of resonant tunneling diodes (RTDs) arranged in series between the input voltage and the sense resistor. The circuit further comprises a sequencing circuit arranged in parallel with the plurality of RTDs and configured to conduct a portion of a current flowing between the input voltage and the sense resistor to define a sequential order of triggering of the plurality of RTDs in response to a given magnitude of the input voltage.

20 Claims, 4 Drawing Sheets

SEQUENTIAL TRIGGERING OF SERIES-CONNECTED RESONANT TUNNELING DIODES

TECHNICAL FIELD

This invention relates to electronic circuits, and more specifically to sequential triggering of series-connected resonant tunneling diodes.

BACKGROUND

As electronic technology increases, so also does the demand for advances in digital computing technology. One such driving factor includes advances in the technology of devices that convert analog signals to digital signals, and vice verse, such as for implementation in communications devices. A variety of electronic devices that manipulate analog and digital signals can include resonant tunneling diodes (RTDs). An RTD is a non-linear electronic component that can transition from a positive differential resistance region at a lower range of voltages to a positive differential resistance region at a higher range of voltages in a circuit when the voltage across its terminals reaches or exceeds a critical peak value via a quantum tunneling effect.

Figure 1:
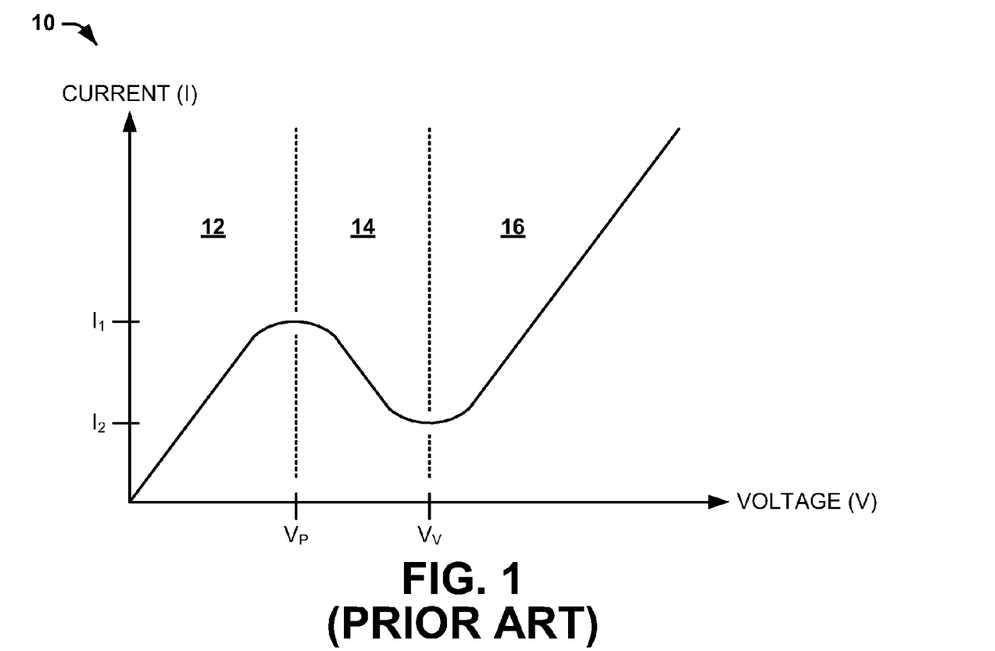
FIG. 1 illustrates an example of a voltage/current graph of a typical resonant tunneling diode (RTD).

FIG. 1 illustrates an example of a voltage/current graph 10 of a typical RTD. The graph 10 is a plot of current (I) on the vertical axis versus voltage (V) on the horizontal axis. The current (I) is thus a current flow through the RTD and the voltage (V) is thus a voltage across the RTD.

The graph 10 demonstrates a first region 12, which is a lower positive differential resistance region, that is defined between zero volts and a peak voltage $V_P$. Thus, in the first region 12, the current (I) exhibits a substantially linear relationship relative to an increase in the voltage (V), with a slight leveling near the peak voltage $V_P$ to a maximum magnitude of $I_1$. The graph 10 also demonstrates a second region 14, which is a negative differential resistance region, that is defined between the peak voltage $V_P$ and a valley voltage $V_V$. The second region 14 is a negative differential resistance region based on a decrease in the current from a magnitude of $I_1$ at the peak voltage $V_P$ to a lesser magnitude $I_2$ at the valley voltage $V_V$. The second region 14 can be unstable in a circuit, such that the RTD may not be able to maintain a voltage (V) between the peak voltage $V_P$ and the valley voltage $V_V$. The graph 10 also includes a third region 16, which is a higher positive differential resistance region, that begins from the valley voltage $V_V$ and increases linearly.

A sequencing device, such as an analog-to-digital converter (ADC), can be designed with a circuit that includes one or more RTDs arranged in series. The one or more RTDs can each be like-sized RTDs with a substantially identical dynamic impedance, such that the circuit can form a series voltage divider. Thus, in response to an input voltage that is applied to the series RTDs, one or more of the RTDs transition, or "trigger", from the peak voltage $V_P$ to the valley voltage $V_V$ to provide a quantization of the input voltage. However, since the dynamic impedance is approximately the same for the RTDs, upon applying the input voltage to the series RTDs, two or more of the RTDs can inadvertently be provided with enough voltage to trigger approximately simultaneously. As a result, there may be an error in the quantization of the input voltage.

SUMMARY

One embodiment of the invention includes a quantization circuit. The circuit comprises a sense resistor configured to provide a voltage that is indicative of a digital quantization of an input voltage. The circuit also comprises a plurality of resonant tunneling diodes (RTDs) arranged in series between the input voltage and the sense resistor. The circuit further comprises a sequencing circuit arranged in parallel with the plurality of RTDs and configured to conduct a portion of a current flowing between the input voltage and the sense resistor to define a sequential order of triggering of the plurality of RTDs in response to a given magnitude of the input voltage.

Another embodiment of the invention includes a method for quantizing an input voltage. The method comprises providing a current flow associated with the input voltage through series-connected RTDs and a sense resistor, and diverting a portion of the current flow from each of the series-connected RTDs through a parallel sequencing circuit. The method also comprises controlling a magnitude of the portion of the current flow from each of the series-connected RTDs individually to define a sequential order of triggering of the series-connected RTDs in response to an increasing magnitude of the input voltage. The method further comprises counting a number of transitions of a voltage across the sense resistor relative to a threshold voltage. The transitions can be associated with the triggering of the series-connected RTDs, with the number of transitions corresponding to a magnitude of the input voltage.

Another embodiment of the invention includes a quantization circuit. The circuit comprises means for indicating a digital quantization of an input voltage based on a quantity of a plurality of RTDs that have triggered in response to the input voltage. The plurality of RTDs can be arranged in series between the input voltage and the means for indicating. The circuit also comprises means for diverting a portion of a current flowing between the input voltage and the means for indicating to define a sequential order of triggering of the plurality of RTDs in response to a given magnitude of the input voltage.

DETAILED DESCRIPTION

The present invention relates to electronic circuits, and more specifically to sequential triggering of series-connected resonant tunneling diodes (RTDs). A series connection of RTDs can include a sequencing circuit that is arranged in parallel with the RTDs. The sequencing circuit can be configured to divert a current flow from an input voltage around one or more of the series RTDs and through a sense resistor. The diverted current flow can be incrementally increasing with respect to the RTDs to define a sequential order in which the RTDs trigger in response to an increasing magnitude of the input voltage.

The sequencing circuit can include transistors acting as switches that are arranged in parallel with each of the respective RTDs. The amount of current that is diverted for each of the RTDs can be based on a bias voltage of each of the transistors. As an example, the bias terminal of each of the transistors can be coupled to a current output terminal of the transistor associated with the immediately preceding RTD in the sequential order. As a result, upon the immediately preceding RTD being triggered, the bias voltage of the transistor decreases, causing the amount of current that is diverted through the transistor to decrease. Accordingly, the current flow through the RTD is the next highest, resulting in the RTD being the next to trigger upon the voltage across the RTD exceeding the critical peak voltage $V_P$.

Figure 2:
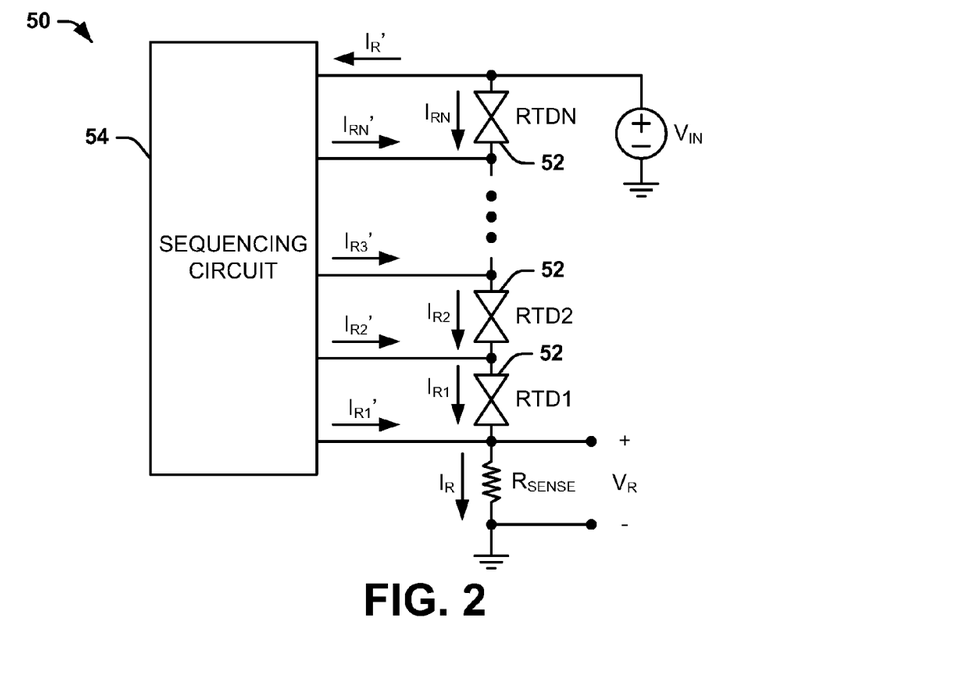
FIG. 2 illustrates an example of an RTD quantization circuit in accordance with an aspect of the invention.

FIG. 2 illustrates an example of an RTD quantization circuit 50 in accordance with an aspect of the invention. The quantization circuit 50 can be configured to provide digital quantization of an input voltage $V_{IN}$. Therefore, the quantization circuit 50 can be included in any of a variety of quantizing electronic devices, such as an analog-to-digital converter, a counter, or any of a variety of related signal processing devices.

The quantization circuit 50 includes a plurality of RTDs 52 that are arranged in a series connection. In the example of FIG. 2, the RTDs 52 are demonstrated as RTD1 to RTDN, where N is a positive integer. The series connection of the RTDs 52 is arranged between the input voltage $V_{IN}$ and a sense resistor $R_{SENSE}$. In the example of FIG. 2, the sense resistor $R_{SENSE}$ is configured to provide an indication of a digital quantization of the input voltage $V_{IN}$, as indicated by a voltage $V_R$ across the sense resistor $R_{SENSE}$. As an example, upon the input voltage $V_{IN}$ being provided to the quantization circuit 50, one or more of the RTDs 52 can trigger. The voltage $V_R$ can cross a threshold voltage at each triggering of an RTD 52, such that a number of transitions of the voltage $V_R$ across the threshold voltage can indicate the number of RTDs that have triggered in response to the input voltage $V_{IN}$. Accordingly, the digital quantization of the input voltage $V_{IN}$ can correspond to the number of transitions, and thus the number of triggered RTDs 52.

The quantization circuit 50 also includes a sequencing circuit 54. The sequencing circuit 54 is configured to divert a portion of a current $I_R$ that flows from the input voltage $V_{IN}$ and through the sense resistor $R_{SENSE}$ to a negative voltage rail, demonstrated as ground in the example of FIG. 2. Specifically, the sequencing circuit 54 diverts a current $I_R'$ from flowing through the series connection of RTDs 52 and provides an incrementally increasing amount of current back to each of RTDs 52 in the series connection from RTDN to RTD1. As a result, the sequencing circuit 54 can define a sequential order in which the RTDs 52 trigger in response to an increase in the input voltage $V_{IN}$. As an example, the sequencing circuit 54 can include bypass switches that are individually configured in parallel with the RTDs 52. As a result, the bypass switches can be controlled such that, upon the triggering of an RTD 52 in the sequential order, a change in voltage across the RTD 52 can cause the switch that is in parallel with the next RTD 52 in the sequential order can be deactivated, such that a portion of the current $I_R$ is no longer diverted around the next RTD 52 in the sequential order. Accordingly, the increase in current flow through the next RTD 52 causes it to trigger next.

In the example of FIG. 2, the current $I_R'$ is diverted from the series connection of the RTDs 52, with a current $I_{RN}$ flowing through RTDN. The magnitude of the current $I_R'$ can be significantly larger than the current $I_{RN}$. The sequencing circuit then adds a portion of the current $I_R'$ back to the series connection of the RTDs 52, such that a current $I_{RN}'$ is added to the current $I_{RN}$ to flow through an RTDN-1 (not shown). A current $I_{R2}'$ is added to a current $I_{R2}$ that flows through RTD2, such that a current $I_{R1}$, which is a sum of the currents $I_{R2}$ and $I_{R2}'$, is generated and flows through RTD1. A current $I_{R1}'$, which is a remaining portion of the current $I_R'$, is added to the current $I_{R1}$ to thus provide the total current $I_R$ at the output of the series connection of RTDs 52, such that the current $I_R$ flows through the sense resistor $R_{SENSE}$ and into ground. As a result, the sequencing circuit 54 thus substantially prevents most of the current $I_R$ from flowing through the RTDs 52 except for the next RTD 52 in the sequence to trigger as well as the RTDs 52 that have already triggered.

Therefore, it is demonstrated that the RTDs 52 conduct an incrementally decreasing amount of current from RTD1 to RTDN. As a result, the sequencing circuit 54 defines the sequential order of triggering of the RTDs 52 from RTD1 to RTDN based on diverting the portion $I_R'$ of the current $I_R$ and providing incrementally decreasing portions of the current $I_R'$ back to the RTDs 52. In addition, upon the triggering of one of the RTDs 52 in the series connection, the sequencing circuit 54 can be configured to adjust the individual portions of the currents provided to the individual RTDs 52, such that the next RTD 52 in the sequential order can be provided more of the diverted current to ensure that it will be the next RTD 52 in the sequential order to trigger. Accordingly, because the RTDs 52 trigger in a sequential order, concurrent triggering of the RTDs 52, such as resulting in a digital quantization error, is substantially mitigated.

Figure 3:
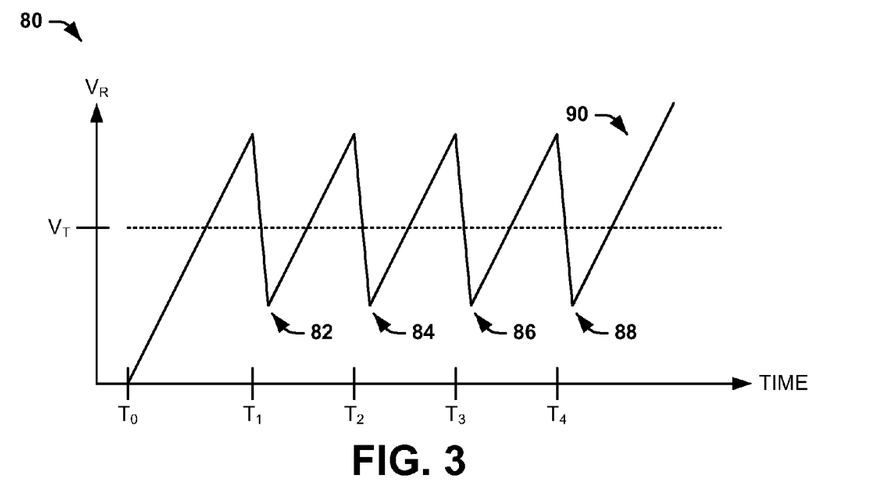
FIG. 3 illustrates an example of a timing diagram of an RTD quantization circuit in accordance with an aspect of the invention.

FIG. 3 illustrates an example of a timing diagram 80 of an RTD quantization circuit in accordance with an aspect of the invention. The timing diagram 80 can correspond to timing of the RTD quantization circuit 50 in the example of FIG. 2. Therefore, reference is to be made to the example of FIG. 2 in the following description of the example of FIG. 3. In addition, it is to be understood that, in the example of FIG. 3, the quantity N of RTDs 52 is four. Therefore, the example of FIG. 3 describes RTD1 through RTD4, with currents $I_{R1}$ through $I_{R4}$ flowing through RTD1 through RTD4, respectively. In addition, it is to be understood that the graph 10 is illustrated as an ideal graph, such that inherent variations in relative magnitudes and/or non-linear characteristics are not demonstrated in the example of FIG. 3.

The timing diagram 80 demonstrates the voltage $V_R$ plotted across time. At a time $T_0$, the input voltage $V_{IN}$ begins to increase. Therefore, the voltage $V_R$, which is directly proportional to the current $I_R$, likewise begins to increase. As described above, the sequencing circuit 54 defines the sequential order of triggering based on setting an incrementally increasing magnitude of current through each of the RTDs 52 in the sequential order, such that the current $I_{R1}$ is greater than the current $I_{R2}$, which is greater than the current $I_{R3}$, which is greater than the current $I_{R4}$.

At a time $T_1$, the current $I_{R1}$ achieves a magnitude (e.g., $I_1$ in the example of FIG. 1) that is sufficient to trigger RTD1. Upon RTD1 triggering, RTD1 enters a negative differential resistance region, resulting in a decrease of the current $I_R$, and thus a decrease of the voltage $V_R$, indicated in the example of FIG. 3 at 82. In the example of FIG. 3, the decrease of voltage $V_R$ occurs very rapidly by an amount that is approximately equal to the valley voltage $V_V$ minus the peak voltage $V_P$, and the voltage $V_R$ decreases less than a threshold voltage $V_T$. The first decrease of the voltage $V_R$ less than the threshold voltage $V_T$ thus signals a first digital quantization of the input voltage $V_{IN}$. In addition, upon RTD1 triggering, the voltage across RTD1 increases by an amount that is approximately equal to the decrease of the voltage $V_R$ (i.e., $V_V$ minus $V_P$).

Subsequent to the triggering of RTD1, the input voltage $V_{IN}$ continues to increase, resulting in a continued increase of the current $I_R$, and thus a continued increase of the voltage $V_R$. At a time $T_2$, the current $I_{R2}$ achieves a magnitude that is sufficient to trigger RTD2. Upon RTD2 triggering, RTD2 enters a negative differential resistance region, resulting in a decrease in the current $I_R$, and thus a decrease in the voltage $V_R$ less than the threshold voltage $V_T$, indicated in the example of FIG. 3 at 84. The second decrease of the voltage $V_R$ less than the threshold voltage $V_T$ thus signals a second digital quantization of the input voltage $V_{IN}$.

Subsequent to the triggering of RTD2, the input voltage $V_{IN}$ continues to increase, resulting in a continued increase of the current $I_R$, and thus a continued increase of the voltage $V_R$. At a time $T_3$, the current $I_{R3}$ achieves a magnitude that is sufficient to trigger RTD3. Upon RTD3 triggering, RTD3 enters a negative differential resistance region, resulting in a decrease in the current $I_R$, and thus a decrease in the voltage $V_R$ less than the threshold voltage $V_T$, indicated in the example of FIG. 3 at 86. The third decrease of the voltage $V_R$ less than the threshold voltage $V_T$ thus signals a third digital quantization of the input voltage $V_{IN}$.

Subsequent to the triggering of RTD3, the input voltage $V_{IN}$ continues to increase, resulting in a continued increase of the current $I_R$, and thus a continued increase of the voltage $V_R$. At a time $T_4$, the current $I_{R4}$ achieves a magnitude that is sufficient to trigger RTD4. Upon RTD4 triggering, RTD4 enters a negative differential resistance region, resulting in a decrease in the current $I_R$, and thus a decrease in the voltage $V_R$ less than the threshold voltage $V_T$, indicated in the example of FIG. 3 at 88. The fourth decrease of the voltage $V_R$ less than the threshold voltage $V_T$ thus signals a fourth and final digital quantization of the input voltage $V_{IN}$. Accordingly, subsequent to the fourth digital quantization of the input voltage $V_{IN}$, the voltage $V_R$ increases linearly with increases of the input voltage $V_{IN}$, as indicated in the example of FIG. 3 at 90.

It is thus demonstrated in the example of FIG. 3 that the digital quantization of the input voltage $V_{IN}$ can be ascertained based on a number of negative crossings of the voltage $V_R$ relative to the threshold voltage $V_T$. By setting the sequential order of the triggering of the RTDs 52 at distinct times relative to each other, the sequencing circuit 54 thus mitigates concurrent triggering of one or more of the RTDs 52, which could result in an error in the digital quantization of the input voltage $V_{IN}$. As an example, an error in the digital quantization of the input voltage $V_{IN}$ can occur as a result of a single negative crossing of the voltage $V_R$ relative to the voltage $V_T$ for the triggering of more than one of the RTDs 52. As a result, based on the sequential triggering of the RTDs 52, an electronic component that is configured to count the negative crossings can identify an appropriate digital quantization of the input voltage $V_{IN}$ substantially without errors.

Figure 4:
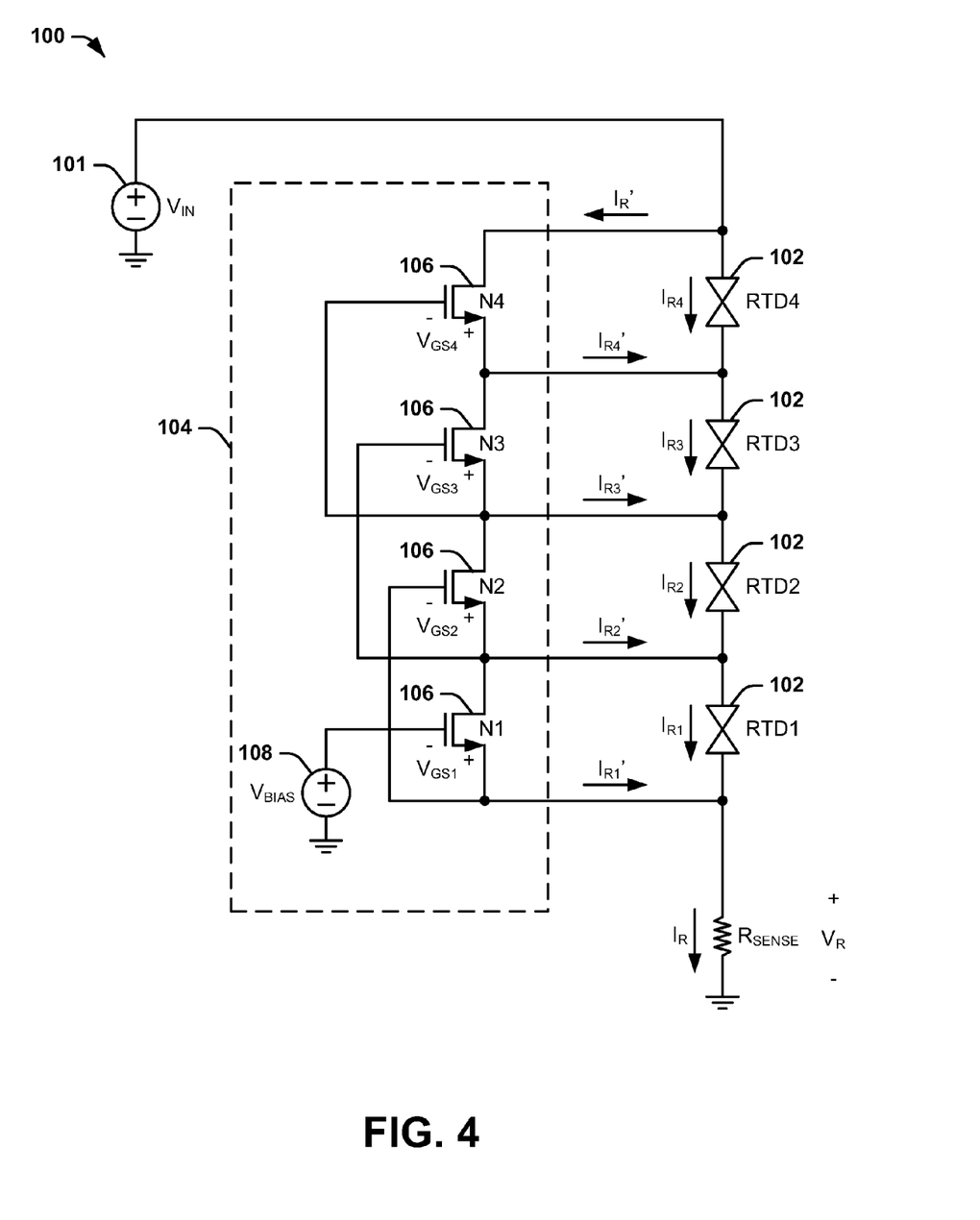
FIG. 4 illustrates another example of an RTD quantization circuit in accordance with an aspect of the invention.

FIG. 4 illustrates another example of an RTD quantization circuit 100 in accordance with an aspect of the invention. The quantization circuit 100 can be configured to provide digital quantization of an input voltage $V_{IN}$ that is provided from a voltage source 101. Therefore, the quantization circuit 100 can be included in any of a variety of quantizing electronic devices, such as an analog-to-digital converter, a counter, or any of a variety of related signal processing devices.

The quantization circuit 100 includes a plurality of RTDs 102, demonstrated as RTD1 through RTD4 in the example of FIG. 4, that are arranged in a series connection. The series connection of the RTDs 102 is arranged between the input voltage $V_{IN}$ and a sense resistor $R_{SENSE}$. In the example of FIG. 4, the sense resistor $R_{SENSE}$ is configured to provide an indication of a digital quantization of the input voltage $V_{IN}$, as indicated by a voltage $V_R$ across the sense resistor $R_{SENSE}$. As an example, upon the input voltage $V_{IN}$ being provided to the quantization circuit 100, one or more of the RTDs 102 can trigger. The voltage $V_R$ can cross a threshold voltage at each triggering of an RTD 102, such that a number of transitions of the voltage $V_R$ across the threshold voltage can indicate the number of RTDs that have triggered in response to the input voltage $V_{IN}$. Accordingly, the digital quantization of the input voltage $V_{IN}$ can correspond to the number of transitions, and thus the number of triggered RTDs 102.

The quantization circuit 100 also includes a sequencing circuit 104. The sequencing circuit 104 is configured to divert a portion of a current $I_R$ that flows from the input voltage $V_{IN}$ and through the sense resistor $R_{SENSE}$ to a negative voltage rail, demonstrated as ground in the example of FIG. 4. Specifically, the sequencing circuit 104 diverts a current $I_R'$ from flowing through the series connection of RTDs 102 and provides an incrementally increasing amount of current back to each of RTDs 102 in the series connection from RTD4 to RTD1. As a result, the sequencing circuit 104 can define a sequential order in which the RTDs 102 trigger in response to an increase in the input voltage $V_{IN}$. Specifically, in the example of FIG. 4, the sequential order is defined as the triggering of RTD1, followed by RTD2, followed by RTD3, followed by RTD4 in response to an increasing magnitude of the input voltage $V_{IN}$.

The sequencing circuit 104 includes a plurality of bypass transistors 106, demonstrated in the example of FIG. 4 as N1 through N4. In the example of FIG. 4, the bypass transistors 106 are demonstrated as N-type field effect transistors (N-FETs), and can be configured as depletion-mode transistors. As an example, the bypass transistors 106 can be Gallium Arsenide (GaAs) MESFET transistors. However, it is to be understood that the quantization circuit 100 is not limited to the use of depletion-mode N-FETs, but could include any of a variety of transistors. Each of the bypass transistors 106 is configured in parallel with a respective one of the RTDs 102, such that the transistor N1 is configured in parallel with RTD1, the transistor N2 is configured in parallel with RTD2, the transistor N3 is configured in parallel with RTD3, and the transistor N4 is configured in parallel with RTD4. Therefore, each of the bypass transistors 106 is configured to conduct a portion of the current $I_R'$, and thus divert a portion of the current $I_R$, based on a relative bias of each of the bypass transistors 106 to define a sequential order of triggering of each of the RTDs 102.

The bias of each of the bypass transistors 106 is set based on coupling the bias terminal (i.e., gate) to a current output terminal (i.e., source) of the bypass transistor 106 associated with the immediately preceding RTD 102 in the sequential order. Specifically, the transistor N4 has a gate coupled to a source of the transistor N3, the transistor N3 has a gate coupled to a source of the transistor N2, and the transistor N2 has a gate coupled to a source of the transistor N1. The transistor N1 has a gate coupled to a bias voltage source 108 that applies a programmable bias voltage $V_{BIAS}$ to the gate of the transistor N1. As an example, the magnitude of the bias voltage $V_{BIAS}$ can be set to adjust the magnitude of the voltage $V_{IN}$ at which the first RTD 102 in the sequential order (i.e., RTD1) triggers. Specifically, the bias voltage $V_{BIAS}$ can set a resistance magnitude of the transistor N1 to provide precise control of the amount of current that is diverted from RTD1.

As an example, based on the coupling of the gates of the bypass transistors 106 to the sources of the respective bypass transistors 106 of the immediately preceding RTD 102 in the sequential order, the bypass transistors 106 can operate in a linear mode. Specifically, each can conduct an incrementally decreasing amount of current from the transistor N4 to the transistor N1, such that the current flowing through the RTDs 102 is incrementally increasing from RTD4 to RTD1. Described in another manner, the bias of the bypass transistors 106 is such that the current flow through the RTDs 102 is incrementally decreasing in the sequential order of triggering based on an incrementally increasing current that is diverted through the respective bypass transistors 106. As another example, the bypass transistors 106 can act as switches over a non-linear range with substantially greater changes in the current $I_R$. Additionally, as demonstrated in the example of FIG. 4, since the bypass transistors 106 can be configured as depletion-mode transistors, they can conduct current with a negative gate-source voltage $V_{GS}$.

The current $I_R'$ is diverted from the series connection of the RTDs 102 to flow through the transistor N4, with a current $I_{R4}$ flowing through RTD4. The magnitude of the current $I_R'$ can be significantly larger than the current $I_{R4}$ based on a larger bias (i.e., less negative $V_{GS}$). The sequencing circuit then adds a portion of the current $I_R'$ back to the series connection of the RTDs 52, such that a current $I_{R4}'$ is provided from the current output from the transistor N4 and is added to the current $I_{R4}$ to flow through RTD3. Thus, the transistor N3 conducts a magnitude of current of $I_R'-I_{R4}'$, which is less current than that conducted by the transistor N4. However, RTD3 conducts a current $I_{R3}$ of magnitude $I_{R4}+I_{R4}'$, which is greater than the current $I_{R4}$ that flows through RTD4. The transistor N2 thus conducts a current of magnitude $I_R'-I_{R4}'-I_{R3}'$, and the transistor N1 thus conducts a current of magnitude $I_R'-I_{R4}'-I_{R3}'-I_{R2}'$. However, RTD2 conducts a current $I_{R2}$ of magnitude $I_{R3}+I_{R3}'$, and RTD1 thus conducts a current $I_{R1}$ of magnitude $I_{R2}+I_{R2}'$, respectively. Therefore, the sense resistor $R_{SENSE}$ receives the entirety of the current $I_R$, which is a sum of the currents $I_{R1}$ and $I_{R1}'$, such that the current $I_R$ flows through the sense resistor $R_{SENSE}$ and into ground.

In addition, as demonstrated in the graph 10 of the example of FIG. 1, upon a given one of the RTDs 102 triggering, the voltage across the given RTD 102 increases rapidly from the peak voltage $V_P$ to the valley voltage $V_V$ based on the negative differential resistance region 14 being unstable. As a result, based on the coupling of the gates of the bypass transistors 106 to the sources of the respective bypass transistors 106 of the immediately preceding RTD 102 in the sequential order, the gate-source voltage $V_{GS}$ of the next bypass transistor 106 in the sequential order decreases (i.e., becomes more negative). Therefore, the next bypass transistor 106 in the sequential order begins to conduct less current or deactivates entirely (i.e., enters cutoff mode). As a result, the respective next RTD 102 in the sequential order conducts more current, thus further ensuring that it will trigger next in the sequential order for increasing magnitudes of the input voltage $V_{IN}$.

It is thus demonstrated that the current flow through the bypass transistors 106 continues to incrementally decrease from the transistor N4 to the transistor N1 and the current flow through the RTDs 102 continues to incrementally increase from RTD4 to RTD1. It is also thus demonstrated that the triggering of the RTDs 102 adjusts the bias of the bypass transistors 106 of the subsequent RTDs 102 in the sequential order. Accordingly, the sequential order of triggering of the RTDs 102 is based on the relative magnitudes of current that flow through the RTDs 102 in response to increasing magnitudes of the input voltage $V_{IN}$. As a result, the voltage $V_R$ can be monitored for transitions relative to a threshold voltage $V_T$ to obtain a digital quantization of the input voltage $V_{IN}$ that is substantially free from quantization errors.

It is to be understood that the quantization circuit 100 is not intended to be limited to the example of FIG. 4. As an example, the input voltage $V_{IN}$ can be provided as a negative voltage that draws the current $I_R$ from RTD1, such that the locations of the voltage source 101 and the sense resistor $R_{SENSE}$ can be swapped. As another example, the bias voltages of each of the bypass transistors 106 can be individually controlled, as opposed to interconnected to the source of the bypass transistor 106 of the immediately preceding RTD 102 in the sequential order. Furthermore, because RTD1 can be designated the first of the RTDs 102 in the sequential order to trigger, the transistor N1 and the bias voltage source 108 could be omitted, such that none of the current $I_R$ is diverted from RTD1, even in an untriggered state. Accordingly, the quantization circuit 100 can be configured in any of a variety of ways.

Figure 5:
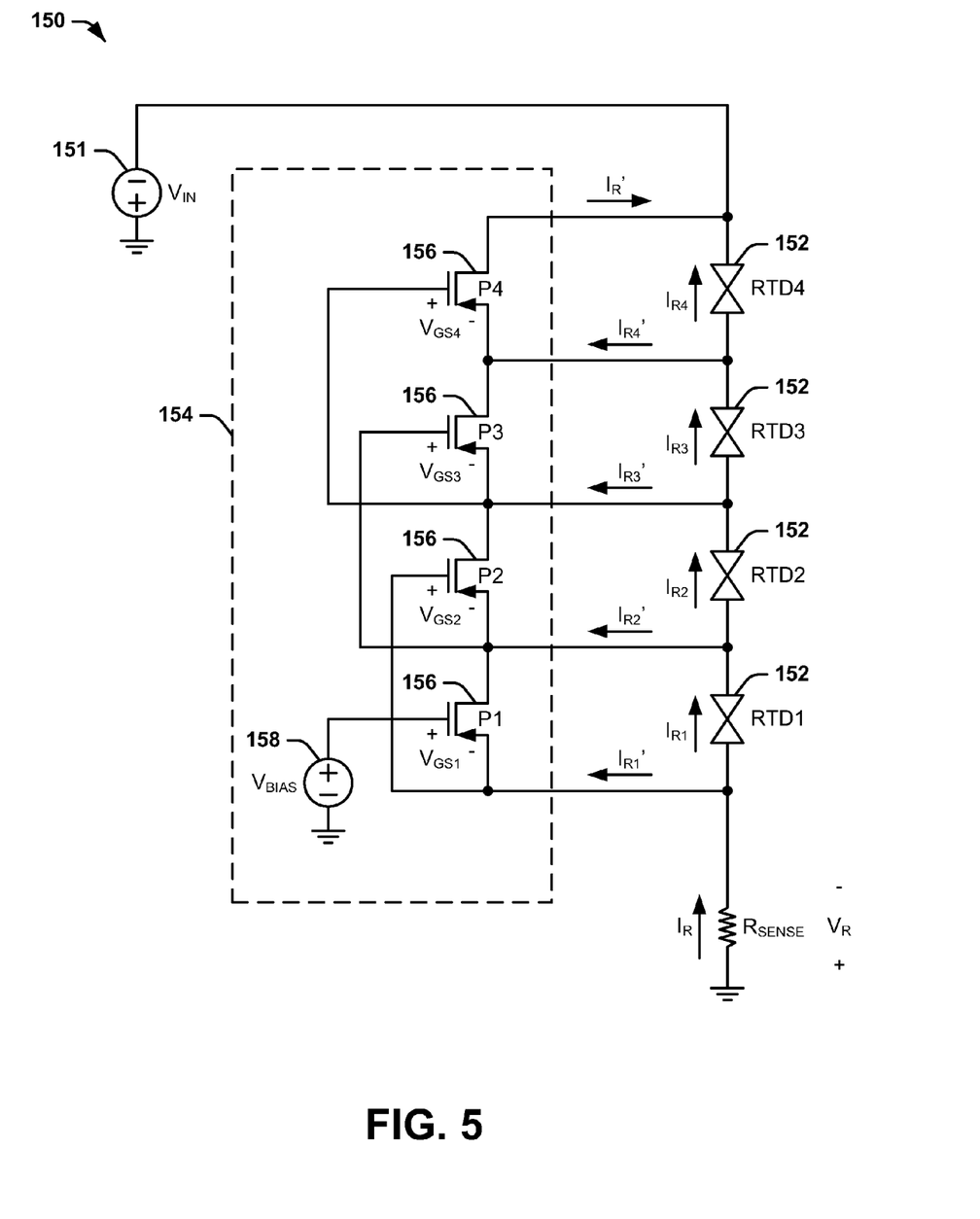
FIG. 5 illustrates another example of an RTD quantization circuit in accordance with an aspect of the invention.

FIG. 5 illustrates another example of an RTD quantization circuit 150 in accordance with an aspect of the invention. The quantization circuit 150 can likewise be configured to provide digital quantization of an input voltage $V_{IN}$ that is provided from a voltage source 151. Therefore, the quantization circuit 150 can be included in any of a variety of quantizing electronic devices, such as an analog-to-digital converter, a counter, or any of a variety of related signal processing devices.

The quantization circuit 150 includes a plurality of RTDs 152, demonstrated as RTD1 through RTD4 in the example of FIG. 5, that are arranged in a series connection, and a sequencing circuit 154. Therefore, the quantization circuit 150 is configured similar to the quantization circuit 100 in the example of FIG. 4. However, in the example of FIG. 5, the input voltage $V_{IN}$ is negative, such that the current $I_R$ that flows through the sense resistor $R_{SENSE}$ is provided from ground. Accordingly, the sequencing circuit 154 includes a respective plurality of bypass transistors 156, depicted as P1 through P4, respectively, that are demonstrated in the example of FIG. 5 as depletion-mode P-type field effect transistors (P-FETs). The transistor P1 is demonstrated in the example of FIG. 5 as having a gate coupled to a bias voltage source 158 that applies a programmable bias voltage $V_{BIAS}$ to the gate of the transistor P1.

In the example of FIG. 5, based on the negative potential of the input voltage $V_{IN}$ relative to ground, and based on the inclusion of P-type bypass transistors 156, the polarities are reversed for the currents flowing through the RTDs 152, the currents flowing through the bypass transistors 156, the gate-source voltage $V_{GS}$ of each of the bypass transistors 156, and the voltage $V_R$. Otherwise, the quantization circuit 150 operates substantially the same as the quantization circuit 100 described above in the example of FIG. 4. Specifically, the current flow through the RTDs 152 incrementally decreases from RTD1 through RTD4 based on an incrementally increasing current flow through the bypass transistors 156 from the transistor P1 through the transistor P4, respectively. Accordingly, the sequencing circuit 154 defines a sequential order of triggering of the RTDs 152 from RTD1 through RTD4, similar to as described above in the example of FIG. 4.

It is to be understood that the quantization circuit 150 is not intended to be limited to the example of FIG. 5. As an example, the input voltage $V_{IN}$ can be provided as a positive voltage that provides the current $I_R$ to RTD1, such that the locations of the voltage source 151 and the sense resistor $R_{SENSE}$ can be swapped. As another example, the bias voltages of each of the bypass transistors 156 can be individually controlled, as opposed to interconnected to the source of the bypass transistor 156 of the immediately preceding RTD 152 in the sequential order. Accordingly, the quantization circuit 150 can be configured in any of a variety of ways.

Figure 6:
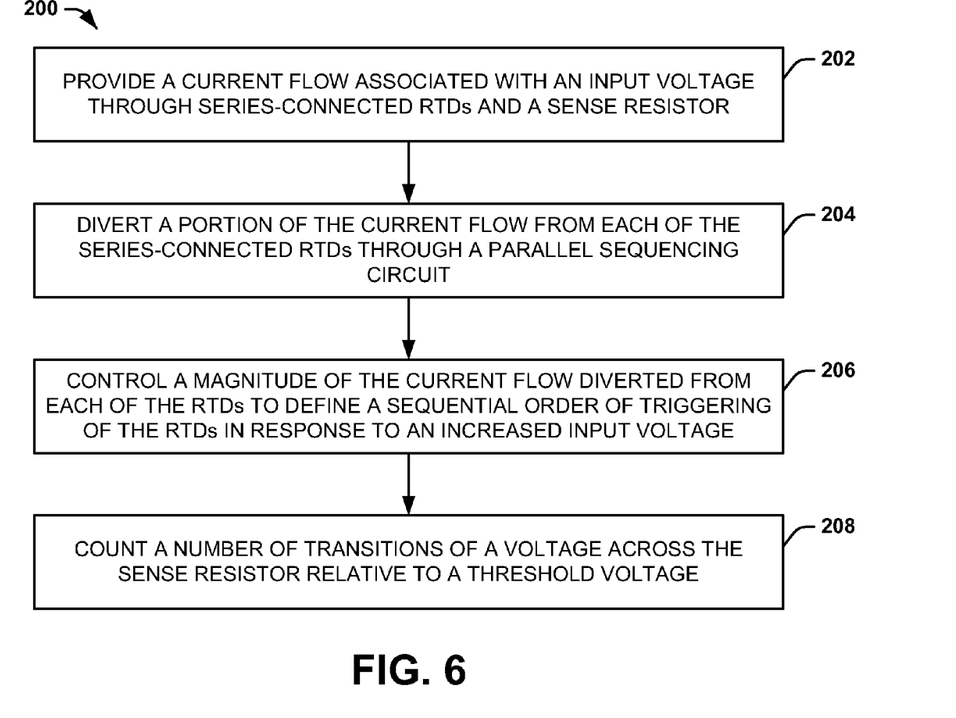
FIG. 6 illustrates a method for quantizing an input voltage in accordance with an aspect of the invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 illustrates a method 200 for quantizing an input voltage in accordance with an aspect of the invention. At 202, a current flow associated with the input voltage is provided through series-connected RTDs and a sense resistor. The input voltage can be positive, such that the current is provided from the input voltage, or negative, such that the current is provided from a negative voltage rail. The sense resistor can be a resistor having a voltage that is indicative of the quantization of the input voltage. At 204, a portion of the current flow is diverted from each of the series-connected RTDs through a parallel sequencing circuit. The parallel sequencing circuit can include a transistor associated with each of the RTDs, with each transistor being configured to conduct the diverted portion of the current flow.

At 206, a magnitude of the portion of the current flow diverted from each of the series-connected RTDs is individually controlled to define a sequential order of triggering of the series-connected RTDs in response to an increasing magnitude of the input voltage. The magnitude can be controlled based on setting the bias of the transistors to set an incrementally decreasing magnitude of current flowing through each of the RTDs in the sequential order based on diverting an incrementally increasing current through the transistors associated with each of the respective RTDs. The bias terminals of the transistors can be coupled to a current output terminal of the transistors of the immediately preceding RTDs in the sequential order, such that upon the immediately preceding RTD triggering, the current flow through the next RTD increases to ensure that it will trigger next.

At 208, a number of transitions are counted of a voltage across the sense resistor relative to a threshold voltage. The transitions can be associated with the triggering of the series-connected RTDs, with the number of transitions corresponding to a magnitude of the input voltage. The digital quantization of the input voltage can thus correspond to the number of transitions. Thus, the sequential triggering of the RTDs can be implemented in quantization of an input voltage in a counter, ADC, or any of a variety of other signal processing devices.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A quantization circuit comprising:
a sense resistor configured to provide a voltage that is indicative of a digital quantization of an input voltage;
a plurality of resonant tunneling diodes (RTDs) arranged in series between the input voltage and the sense resistor; and
a sequencing circuit arranged in parallel with the plurality of RTDs and configured to conduct a portion of a current flowing between the input voltage and the sense resistor to define a sequential order of triggering of the plurality of RTDs in response to a given magnitude of the input voltage.

2. The circuit of claim 1, wherein the sequencing circuit is configured to set an incrementally decreasing amount of the current conducted through each of the plurality of RTDs relative to each other to define the sequential order of triggering.

3. The circuit of claim 1, wherein the sequencing circuit comprises a plurality of transistors, each of the transistors being associated with a respective one of the plurality of RTDs and configured to control an amount of the current flowing through the respective one of the plurality of RTDs.

4. The circuit of claim 3, wherein each of the plurality of transistors is arranged in parallel with the respective one of the plurality of RTDs, the amount of current flowing through the respective one of the plurality of RTDs being based on a magnitude of a voltage at a bias terminal of an associated one of the plurality of transistors.

5. The circuit of claim 3, wherein each of the transistors comprises a bias terminal coupled to a current output terminal of an immediately preceding RTD in the sequential order, and comprises a current output terminal coupled to a current input terminal of the immediately preceding RTD in the sequential order, such that a voltage between the bias terminal and the current output terminal of a given one of the transistors is set to increase the amount of current flowing through a respective one of the RTDs upon the immediately preceding RTD being triggered.

6. The circuit of claim 5, wherein, upon the immediately preceding RTD in the sequential order being triggered, the voltage between the bias terminal and the current output terminal of the given one of the transistors is increased to substantially deactivate the given one of the transistors.

7. The circuit of claim 3, wherein the sequencing circuit comprises a voltage source configured to provide a bias voltage to a bias terminal of a given one of the plurality of transistors associated with a respective one of the plurality of RTDs that is first in the sequential order, the bias voltage having a magnitude that is set to define a magnitude of the input voltage at which the respective one of the plurality of RTDs triggers.

8. The circuit of claim 3, wherein the plurality of transistors are depletion-mode field effect transistors.

9. The circuit of claim 1, wherein the input voltage has a negative magnitude.

10. An analog-to-digital converter comprising the sequencing circuit of claim 1.

11. A method for quantizing an input voltage, the method comprising:
providing a current flow associated with the input voltage through series-connected resonant tunneling diodes (RTDs) and a sense resistor;
diverting a portion of the current flow from each of the series-connected RTDs through a parallel sequencing circuit;
controlling a magnitude of the portion of the current flow from each of the series-connected RTDs individually to define a sequential order of triggering of the series-connected RTDs in response to an increasing magnitude of the input voltage; and
counting a number of transitions of a voltage across the sense resistor relative to a threshold voltage, the transitions being associated with the triggering of the series-connected RTDs, the number of transitions corresponding to a magnitude of the input voltage.

12. The method of claim 11, wherein controlling the magnitude of the portion of the current flow comprises individually setting a magnitude of a bias voltage for a plurality of transistors that are each configured in parallel with a respective one of the series-connected RTDs.

13. The method of claim 12, wherein individually setting the magnitude of the bias voltage comprises setting the magnitude of the bias voltage for each of the plurality of transistors to divert an incrementally increasing amount of the current conducted through each of the plurality of transistors relative to each other to define the sequential order of triggering of the series-connected RTDs.

14. The method of claim 12, wherein controlling the magnitude of the portion of the current flow comprises decreasing the magnitude of the bias voltage of a given one of the transistors to increase the amount of current flowing through a respective one of the RTDs upon the immediately preceding RTD in the sequential order being triggered.

15. The method of claim 14, further comprising:
coupling a bias terminal of a given one of the transistors to a current output terminal of a transistor associated with an immediately preceding RTD in the sequential order;
wherein decreasing the magnitude of the bias voltage comprises decreasing the bias voltage in response to a decrease in a voltage associated with the current output terminal of the transistor associated with the immediately preceding RTD upon the immediately preceding RTD in the sequential order being triggered.

16. The method of claim 12, further comprising:
providing a bias voltage to a bias terminal of a given one of the plurality of transistors associated with a respective one of the plurality of RTDs that is first in the sequential order; and
setting the bias voltage having a magnitude that is set to define a magnitude of the input voltage at which the respective one of the plurality of RTDs triggers.

17. A quantization circuit comprising:
means for indicating a digital quantization of an input voltage based on a quantity of a plurality of resonant tunneling diodes (RTDs) that have triggered in response to the input voltage, the plurality of RTDs being arranged in series between the input voltage and the means for indicating; and
means for diverting a portion of a current flowing between the input voltage and the means for indicating to define a sequential order of triggering of the plurality of RTDs in response to a given magnitude of the input voltage.

18. The circuit of claim 17, wherein the means for diverting comprises individual means for diverting an incrementally decreasing amount of the current conducted through each of the respective plurality of RTDs relative to each other to define the sequential order of triggering of the current from each of the plurality of RTDs.

19. The circuit of claim 18, wherein a given one of the plurality of RTDs begins to conduct a greater amount of current in response to a triggering of an immediately preceding one of the plurality of RTDs in the sequential order.

20. The circuit of claim 17, wherein the means for diverting comprises means for setting a magnitude of the input voltage at which a first of the plurality of RTDs triggers in the sequential order.

* * * * *